United States Patent [19]
Sato

[11] Patent Number: 5,945,858
[45] Date of Patent: Aug. 31, 1999

[54] CLOCKED FLIP FLOP CIRCUIT WITH BUILT-IN CLOCK CONTROLLER AND FREQUENCY DIVIDER USING THE SAME

[75] Inventor: Masaharu Sato, Tokyo, Japan

[73] Assignee: NEC Corporation, Tokyo, Japan

[21] Appl. No.: 09/050,350

[22] Filed: Mar. 31, 1998

[30] Foreign Application Priority Data

Mar. 31, 1997 [JP] Japan ................................. 9-081342

[51] Int. Cl.[6] ................................................ H03K 3/356
[52] U.S. Cl. ......................... 327/202; 327/203; 327/115
[58] Field of Search ................................. 327/202, 203, 327/208–212, 215, 218, 115, 117, 118; 377/47, 48

[56] References Cited

U.S. PATENT DOCUMENTS

| | | | |
|---|---|---|---|
| 4,585,957 | 4/1986 | Ooms ....................................... | 327/202 |
| 4,606,059 | 8/1986 | Oida ......................................... | 377/47 |
| 4,703,495 | 10/1987 | Bereznak ................................ | 377/108 |
| 5,818,293 | 10/1998 | Brehmer et al. ......................... | 327/202 |

FOREIGN PATENT DOCUMENTS

| | | | |
|---|---|---|---|
| 2-134915 | 5/1990 | Japan ...................................... | 327/202 |
| 6-140883 | 5/1994 | Japan ...................................... | 327/202 |

OTHER PUBLICATIONS

"Microelectronic Circuit" by Sedra et al, pp. 428–436, 1991.

*Primary Examiner*—Tuan T. Lam
*Attorney, Agent, or Firm*—Sughrue, Mion, Zinn, Macpeak & Seas, PLLC

[57] ABSTRACT

A clocked master slave flip flop circuit includes a current mirror circuit with a pair of field effect transistors serving as a constant current source, and the field effect transistors are gated by a clock signal and a complementary clock signal; and the clocked master slave flip flop circuit further includes a built-in logic circuits achieving logic functions inverse to each other, and one the built-in logic circuits and the other field effect transistor are connected in series of one of the field effect transistors and in parallel to the other field effect transistor; the logic circuits are responsive to a clock control signal so as to enable the constant current source, and causes the clocked master slave flip flop circuit to change or maintain a data bit stored therein.

10 Claims, 16 Drawing Sheets

| CLOCK CYCLE | Q3 | Q2 | Q1 |
|---|---|---|---|
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

Fig. 11

| CLOCK CYCLE | Q13 | Q12 | Q11 |
|---|---|---|---|
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |

Fig. 15

CLOCKED FLIP FLOP CIRCUIT WITH BUILT-IN CLOCK CONTROLLER AND FREQUENCY DIVIDER USING THE SAME

FIELD OF THE INVENTION

This invention relates to a flip flop circuit and an application using the same and, more particularly, to a clocked master-slave flip flop circuit with a built-in clock controller appropriate for circuit components of a frequency divider.

DESCRIPTION OF THE RELATED ART

A typical example of a high-speed master-slave flip flop circuit 1 is illustrated in FIG. 1, and the essential part of the prior art master-slave flip flop circuit 1 is implemented by a differential stage. The prior art master-slave flip flop circuit 1 is broken down into a master section MS1 and a slave section SL1, and the circuit configuration is as follows.

N-channel enhancement type field effect transistors M1, M3, M5 and M7 are respectively paired with n-channel enhancement type field effect transistors M2, M4, M6 and M8, and form parallel transistor pairs PP1, PP2, PP3 and PP4. A positive power voltage line VDD supplies positive power voltage VDD through resisters RP1, RL2, RL3 and RL4 to the parallel transistor pairs PP1 to PP4. The gate electrodes of the n-channel enhancement type field effect transistors M2/M3 are respectively connected to the resistors RP2 and PR1, and an input signal D and a complementary input signal DB are supplied to the gate electrodes of the n-channel enhancement type field effect transistors M1 and M4, respectively. On the other hand. an output signal Q and a complementary output signal QB are taken out from the node between the resister RL4 and the parallel transistor pair PP4 and the node between the resister RL3 and the parallel transistor pair PP3.

The n-channel enhancement type field effect transistors M1/M4 are connected through a series of n-channel enhancement type field effect transistors M9/M13 and a resistor RE1 to a ground line GND, and the n-channel enhancement type field effect transistors M2/M3 are connected through n-channel enhancement type field effect transistors M10/M13 and the resistor RE1 to the ground line GND. Similarly, the n-channel enhancement type field effect transistors M5/M8 are connected through a series of n-channel enhancement type field effect transistors M11/M14 and a resistor RE2 to the ground line GND, and the n-channel enhancement type field effect transistors M6/M7 are connected through n-channel enhancement type field effect transistors M12/M14 and the resistor RE2 to the ground line GND.

A clock signal CLK and a complementary clock signal CLKB are supplied to the gate electrodes of the n-channel enhancement type field effect transistors M10/M11 and the gate electrodes of the n-channel enhancement type field effect transistors M9/M12. A strobe signal Vcs is supplied to the gate electrodes of the n-channel enhancement type field effect transistors M13/M14.

The prior art master-slave flip flop circuits 1 form a synchronous frequency divider 2 together with exclusive-OR gates EXOR21/EXOR22 and an AND gate AND21 as shown in FIG. 2. The prior art master-slave flip flop circuit 1 is used as a delayed flip flop circuit, and the three prior art master-slave flip flop circuits are labeled with "DFF21", "DFF22" and "DFF23", respectively. "D", "Q" and "QB" are indicative of an input node, an output node and a complementary output node, respectively, and a combination of "D"/"Q"/"QB" and the numeral "21"/"22"/"23" is labeled to a node of each delayed flip flop circuit DFF21/DFF22/ DFF23.

The pulse repetition period of the clock signal CLK is doubled at the output node Q21 of the delayed flip flop circuit DFF21. An output pulse signal PQ21 at the output node Q21 is doubled at the output node Q22 of the delayed flip flop circuit DFF22, and, accordingly, an output pulse signal PQ22 at the output node Q22 is four times longer than the clock signal CLK. Similarly, the output pulse signal PQ22 is doubled at the output node Q23 of the delayed flip flop circuit DFF23, and, accordingly, an output pulse signal PQ23 at the output node Q23 is eight times longer than the clock signal CLK.

In detail, the clock signal CLK is supplied to the clock node CLK of each delayed flip flop circuit DFF21/DFF22/DFF23, and the complementary output node Q21B is connected to the input node D21. The output nodes Q21 and Q22 are supplied to the input nodes of the exclusive-OR gate EXOR21, and the output node of the exclusive-OR gate EXOR21 is connected to the input node D22. The output nodes Q21 and Q22 are connected to the input nodes of the AND gate AND21, and the output node of the AND gate AND21 and the output node Q23 are connected to the input nodes of the exclusive-OR gate EXOR22. The output node of the exclusive-OR gate EXOR22 is connected to the input node D23.

Description is hereinbelow made on the assumption that logic "1" and logic "0" level is equivalent to a high voltage level and a low voltage level, respectively. A delayed flip flop circuit transfers a logic level from the input node to the output node at the leading edge of a clock pulse CLK. For this reason, the delayed flip flop circuit DFF21 doubles the pulse-repetition period of the clock signal CLK.

The exclusive-OR gate EXOE21 supplies the high voltage level to the input node D22 in cycles "1", "2", "5" and "6" and the low voltage level in the other cycles, and the delayed flip flop circuit DFF22 produces the high voltage level at the output node Q22 in cycles "2" to "3" and "6" to "7". The AND gate AND21 and the exclusive-OR gate EXOR22 supply the high voltage level to the input node D23 in cycles "3", "4", "5" and "6" and the low voltage level in the other cycles. Then, the delayed flip flop circuit DFF23 produces the high voltage level at the output node Q23 in cycles "4", "5", "6" and "7".

The delayed flip flop circuits DFF21/DFF22/DFF23 changes the voltage level at the output nodes thereof at the leading edge of the clock signal CLK, and the clock signal CLK is supplied in parallel to the delayed flip flop circuits DFF21/DFF22/DFF23. For this reason, the output pulse signals PQ21/PQ22/PQ23 are concurrently changed between the high voltage level and the low voltage level.

FIG. 4 illustrates another frequency divider 3, which also uses the prior art master-slave flip flop circuit as the delayed flip flop circuit. The prior art frequency divider 3 produces output pulse signals PQ31, PQ32 and PQ33 twice, four times and six times longer in pulse repetition period than the clock signal CLK.

Three delayed flip flop circuits DFF31/DFF32/DFF33 form the prior art frequency divider together with an exclusive-OR gate EXOR3 1, three AND gates AND31/AND32/AND33 and an OR gate OR31. A clock signal CLK is supplied to the clock node CLK of each delayed flip flop circuit DFF31/DFF32/DFF33, and the output signals PQ31/PQ32/PQ33 are concurrently changed between the high voltage level and the low voltage level.

The complementary output node Q31B is connected to the input node D31, and the clock signal CLK is doubled at the output node Q31 as similar to the delayed flip flop circuit DFF21.

The output nodes Q31 and Q32 are connected to the input nodes of the exclusive-OR gate EXOR31, and the output node of the exclusive-OR gate EXOR31 and the complementary output node Q33B are connected to the input nodes of the AND gate AND31. The output node of the AND gate AND31 is connected to the input node D32. The series of exclusive-OR gate EXOR31 and AND gate AND31 supplies the high voltage level to the input node D32 in cycles "1" and "2" and the low voltage level in the other cycles. The delayed flip flop circuit DFF32 is responsive to the voltage level at the input node D32 so as to produce the high voltage level at the output node Q32 in the next cycles "2" and "3".

The output nodes Q31/Q32 and the complementary output node Q33B are connected to the input nodes of the AND gate AND32, and the output node Q33 and the complementary output nodes Q31B/Q32B are connected to the input nodes of the AND gate AND33. The output nodes of the AND gates AND32/AND33 are connected to the input nodes of the OR gate OR31, and the output node of the OR gate OR31 is connected to the input node D33 of the delayed flip flop circuit DFF33. The combination of AND gates AND32/AND33 and OR gate OR31 supplies the high voltage level to the input node D33 in cycles "3" and "4" and the low voltage level in the other cycles. The delayed flip flop circuit DFF33 is responsive to the voltage level at the input node D33 so as to produce the high voltage level at the output node Q33 in cycles "4" and "5".

The delayed flip flop circuits DFF31/DFF32/DFF33 concurrently change the output pulse signals PQ31/PQ32/PQ33 at the leading edge of the clock signal CLK, and the output pulse signals PQ31/PQ32/PQ33 are twice, four times and six times longer in pulse repetition period than the clock signal CLK.

Thus, the prior art master-slave flip flop circuit 1 is used as an essential circuit component of the frequency dividers 2/3. However, the prior art frequency dividers 2/3 require additional logic gates such as the exclusive-OR gates EXOR21/EXOR22/EXOR31, the AND gates AND21/AND31–AND33 and the OR gate OR31. The prior art mater-slave flip flop circuit 1 simply transfers the voltage level from the input node to the output node at the leading edge of the clock signal CLK, and the prior art frequency divider 2/3 requires appropriately controlled voltage level at the input node of each flip flop circuit. The logic gates EXOR21/AND21/EXOR22 or EXOR31/AND31–AND33/OR31 control the voltage level at the input node of each flip flop circuit. Thus, the logic gates are indispensable for the frequency divider 2/3. However, the logic gates occupy wide area, and are obstacle of high-dense integration. This is the first problem inherent in the prior art.

The second problem is a large amount of electric power consumption. The prior art current mirror type master-slave flip flop circuit 1 requires electric current flowing therethrough at all times for holding a piece of data information, and the current consumption is not ignoreable.

SUMMARY OF THE INVENTION

It is therefore an important object of the present invention to provide a clocked flip flop circuit, which makes a frequency divider improved in occupation area and electric power consumption.

It is also an important object of the present invention to provide a frequency divider implemented by the clocked flip flop circuit.

To accomplish the object, the present invention proposes to share a constant current source and data holding current between a current mirror circuit and built-in logic circuits.

In accordance with one aspect of the present invention, there is provided a flip flop circuit comprising a data storage circuit including a differential amplification stage connected to a first source of power voltage and responsive to a bit of input data information for storing the bit of input data information in the form of potential difference and a constant current source connected to the differential amplification stage and responsive to a clock signal so as to enable the differential amplification stage and a clock controller associated with the constant current source and responsive to a clock data signal so as to enable the constant current source.

In accordance with another aspect of the present invention, there is provided a frequency divider comprising a first delayed flip flop circuit responsive to a clock signal for producing a first output signal twice longer in pulse repetition period than the clock signal and a first complementary output signal complementary to the first output signal and a plurality of second delayed flip flop circuits connected in cascade, and each of the plurality of second delayed flip flop circuit comprises a data storage circuit including a differential amplification stage connected to a first source of power voltage level and having a data input node supplied with a second complementary output signal complementary to a second output signal and a pair of output data nodes for producing the second output signal and the second complementary output signal and a constant current source connected to the differential amplification stage and responsive to a clock signal so as to enable the differential amplification stage and a clock controller associated with the constant current source and responsive to selected one or ones of the first output signal, the first complementary output signal, the second output signal and the second complementary output signal so as to enable the constant current source.

BRIEF DESCRIPTION OF THE DRAWINGS

The features and advantages of the clocked master-slave flip flop circuit will be more clearly understood from the following description taken in conjunction with the accompanying drawings in which:

FIG. 11 is a view showing variation of output signals produced by the equivalent circuit;

FIG. 15 is a view showing variation of output signals produced by the equivalent circuit.

DESCRIPTION OF THE PREFERRED EMBODIMENTS

First Embodiment

Figure 6:
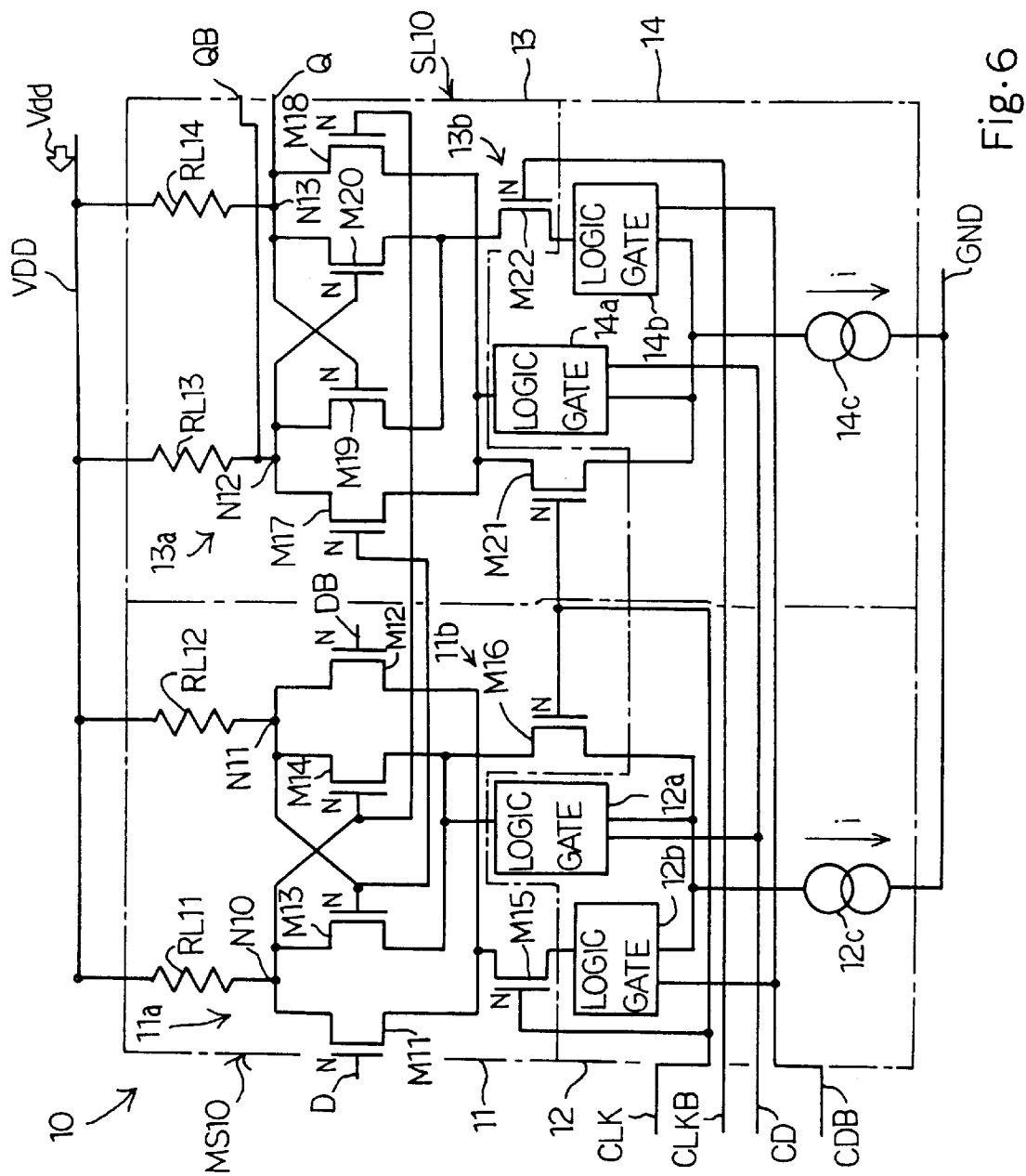
FIG. 6 is a circuit diagram showing the circuit configuration of a clocked master-slave flip flop circuit according to the present invention.

Referring to FIG. 6 of the drawings, a clocked master-slave flip flop circuit 10 embodying the present invention largely comprises a master section MS10 and a slave section SL10. The master section MS10 is broken down into a data storage circuit 11 and a logic circuit 12. The slave section SL10 is also broken down into a data storage circuit 13 and a logic circuit 14. In the following description, a high voltage level and a low voltage level are assumed to be equivalent to logic "1" and logic "0", respectively.

The data storage circuit 11 is further broken down into a differential amplifier stage 11a and a constant current source 11b. The differential amplifier stage 11a includes resistors RL11/RL12 connected to a source VDD of positive power voltage Vdd, a first pair of n-channel enhancement type field effect transistors M11/M12 connected between the resistors RL11/RL12 and the constant current source 11b and a second pair of n-channel enhancement type field effect transistors M13/M14 connected in parallel between the resistors RL11/RL12 and the constant current source 11b. A node between the resistor RL11 and the n-channel enhancement type field effect transistors M11/M13 is referred to as "common node N10", and a node between n-channel enhancement type field effect transistors M12/M14 is referred to as "common node N11".

An input data signal D and the complementary input signal DB are supplied to the gate electrodes of the n-channel enhancement type field effect transistors M11/M12, and the common nodes N10/N11 are further connected to the gate electrodes of the n-channel enhancement type field effect transistors M14/M13, respectively.

The constant current source 11b is implemented by two n-channel enhancement type field effect transistors M15/M16. The n-channel enhancement type field effect transistor M15 is connected to the first pair of n-channel enhancement type field effect transistors M11/M12, and the other n-channel enhancement type field effect transistor M16 is connected to the second pair of n-channel enhancement type field effect transistors M13/M14. A clock signal CLK is supplied to the gate electrode of the n-channel enhancement type field effect transistor M15, and the other n-channel enhancement type field effect transistor M16 is gated by the complementary clock signal CLKB.

The data storage circuit 11 behaves as follows. An input data bit is represented by the input data signal D and the complementary input data signal DB. The input data signal D and the complementary input data signal DB are assumed to be in the high voltage level and the low voltage level, respectively. When the complementary clock signal CLKB is changed to the high voltage level, the n-channel enhancement type field effect transistor M15 turns on, and the n-channel enhancement type field effect transistors M11/M12 start the differential amplification. The n-channel enhancement type field effect transistor M11 increases the amount of channel current, and decreases the voltage level at the common node N10. On the other hand, the n-channel enhancement type field effect transistor M12 decreases the amount of channel current, and increases the voltage level at the common node N11.

When the complementary clock signal CLKB is changed to the low voltage level, the clock signal CLK of the high voltage level causes the n-channel enhancement type field effect transistor M16 to turn on, and the n-channel enhancement type field effect transistor M16 activates the second pair of n-channel enhancement type field effect transistors M13/M14. The high voltage level at the common node N11 causes the n-channel enhancement type field effect transistor M13 to flow a large amount of current, and the low voltage level at the other common node N10 causes the n-channel enhancement type field effect transistor M14 to flow a small amount of current. Thus, the input data bit is stored in the data storage circuit 11b in the form of potential difference between the common nodes N10 and N11.

The data storage circuit 13 is broken down into a differential amplifier stage 13a and a constant current source 13b. The differential amplifier stage 13a includes resistors RL13/RL14 connected to the source VDD of positive power voltage Vdd, a third pair of n-channel enhancement type field effect transistors M11/M12 connected between the resistors RL13/RL14 and the constant current source 13b and a fourth pair of n-channel enhancement type field effect transistors M19/M20 connected in parallel between the resistors RL13/RL14 and the constant current source 13b. A node between the n-channel enhancement type field effect transistors M17/M19 is referred to as "common node N12", and a node between the n-channel enhancement type field effect transistors M18/M20 is referred to as "common node N13". An output data signal Q and the complementary output data signal QB are supplied from the common nodes N13 and N12, respectively.

The potential level at the common node N11 and the potential level at the common node N10 are respectively supplied to the gate electrodes of the n-channel enhancement type field effect transistors M17/M18, and the common nodes N13/N12 are connected to the gate electrodes of the n-channel enhancement type field effect transistors M19/M20, respectively.

The constant current source 13b is implemented by two n-channel enhancement type field effect transistors M21/M22. The n-channel enhancement type field effect transistor M21 is connected to the third pair of n-channel enhancement type field effect transistors M17/M18, and the other n-channel enhancement type field effect transistor M22 is connected to the fourth pair of n-channel enhancement type field effect transistors M19/M20. The clock signal CLK is supplied to the gate electrode of the n-channel enhancement type field effect transistor M21, and the other n-channel enhancement type field effect transistor M22 is gated by the complementary clock signal CLKB.

The data storage circuit 13 behaves as follows. When the clock signal CLK is changed to the high voltage level, the input data bit is stored in the data storage circuit 11a in the form of potential difference between the common nodes N10 and N11, and is concurrently transferred to the third pair of n-channel enhancement type field effect transistors M17/M18, because the clock signal CLK causes the n-channel enhancement type field effect transistors M16/M21 to concurrently turn on. The high voltage level at the common node N11 causes the n-channel enhancement type field effect transistor M17 to increase the amount of channel current, and the potential level at the common node N12 is decreased. On the other hand, the low voltage level at the other common node N10 causes the n-channel enhancement type field effect transistor M18 to decrease the amount of channel current, and the potential level at the common node N13 is increased.

Subsequently, the clock signal CLK is changed to the low voltage level, and, accordingly, the complementary clock signal CLKB is changed to the high voltage level. Then, the n-channel enhancement type field effect transistor M22 turns on, and activates the fourth pair of n-channel enhancement type field effect transistors M19/M20. The n-channel enhancement type field effect transistors M19/M20 start the differential amplification. The potential level at the common node N12 is low, and the other common node N13 is in the high voltage level. Then, the n-channel enhancement type field effect transistor M19 increases the amount of channel current, and maintains the low voltage level at the common node N12. On the other hand, the n-channel enhancement type field effect transistor M20 decreases the amount of channel current, and maintains the high voltage level at the common node N13. Thus, the input data bit is transferred from the master section MS10 to the slave section SL10.

The logic circuit 12 has a first logic gate 12a coupled in parallel to the n-channel enhancement type field effect transistor M16, a second logic gate 12b coupled in series to the n-channel enhancement type field effect transistor M15 and a constant current source 12c connected between a ground line GND and the logic gates 12a/12b. A clock control data signal CD and the complementary clock data signal CDB represents a control data bit, and are supplied to the first logic gate 12a and the second logic gate 12b, respectively. The logic gates 12a/12b are responsive to the control data bit, and either invert or maintain the logic level of the input data bit.

The logic circuit 14 also has a third logic gate 14a coupled in parallel to the n-channel enhancement type field effect transistor M21, a fourth logic gate 14b coupled in series to the n-channel enhancement type field effect transistor M22 and a constant current source 14c connected between the ground line GND and the logic gates 14a/14b. The clock control data signal CD and the complementary clock data signal CDB are supplied to the third logic gate 14a and the fourth logic gate 14b, respectively. The logic gates 14a/14b are responsive to the control data bit, and either inverts or maintains the logic level of the data bit transferred to the slave section SL10.

Figure 7:
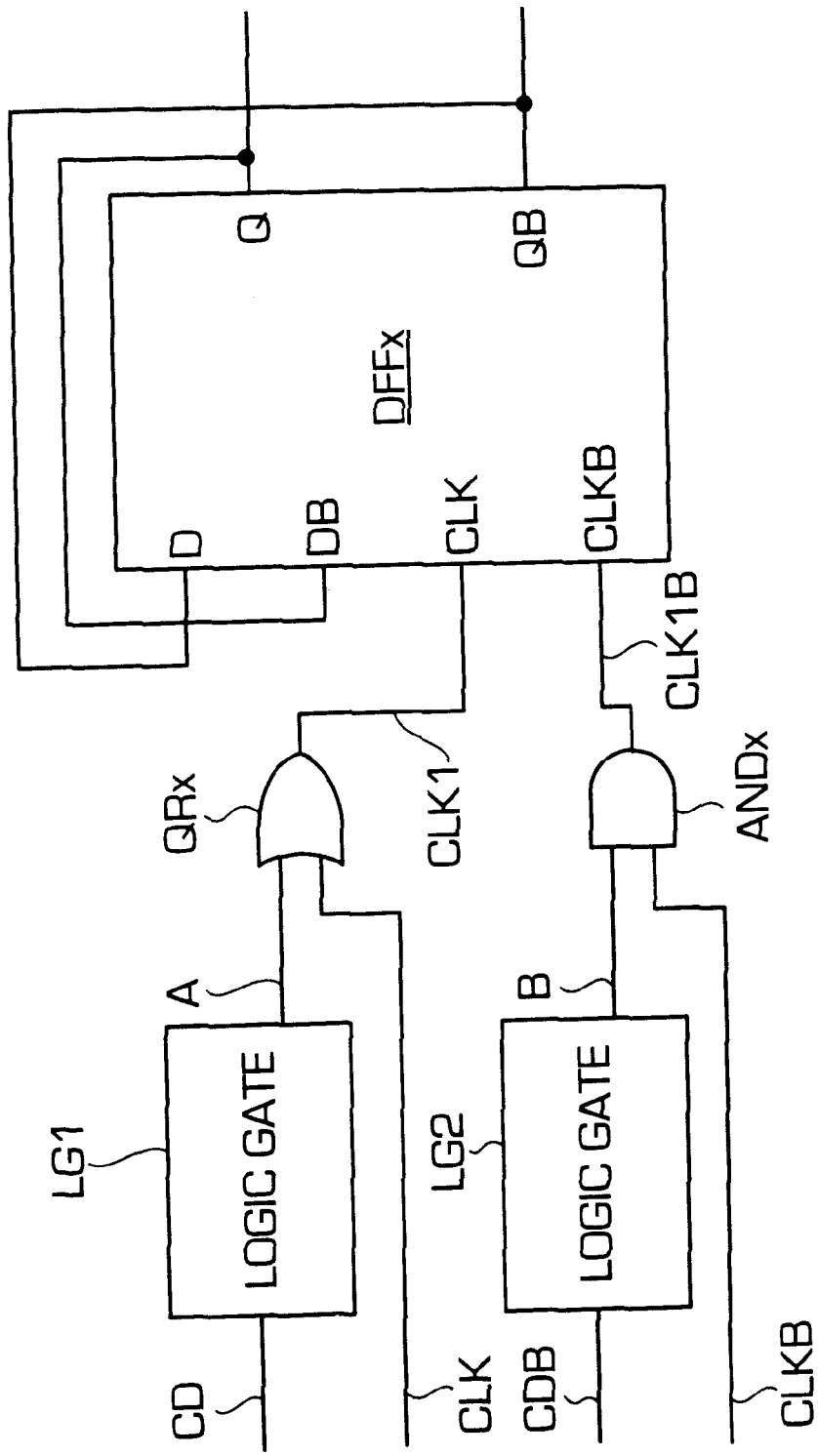
FIG. 7 is a circuit diagram showing an equivalent circuit of the clocked master-slave flip flop circuit shown in FIG. 6.

The clocked master-slave flip flop circuit shown in FIG. 6 is equivalent to the circuit configuration shown in FIG. 7. The clocked master-slave flip flop circuit is replaceable with the combination of a delayed flip flop circuit DFFx, an AND gate ANDx, an OR gate ORx and logic gates LG1/LG2. The first logic gate 12a and the third logic gate 14a are equivalent to the logic gate LG1, and the second logic gate 12b and the fourth logic gate 14b are equivalent to the logic gate LG2. In this instance, the logic gates LG1 and LG2 as a whole constitute a built-in clock controller.

The logic gate LG1 directly or indirectly produces an output signal A from the clock data signal CD. In this instance, the output signal A is finally ORed with the clock signal CLK. The OR gate ORx yields a clock signal CLK1, and the clock signal CLK1 is supplied to the clock node of the delayed flip flop circuit DFFx.

Similarly, the logic gate LG2 directly or indirectly produces an output signal B from the complementary clock data signal CDB, and the output signal B is finally ANDed with the complementary clock signal CLKB. The AND gate ANDx produces a complementary clock signal CLK1B, and the complementary clock signal CLK1B is supplied to the complementary clock node CLKB of the delayed flip flop circuit DFFx. In this instance, the output node Q and the complementary output node QB are connected to the complementary input node DB and the input node D, respectively.

Figure 8:
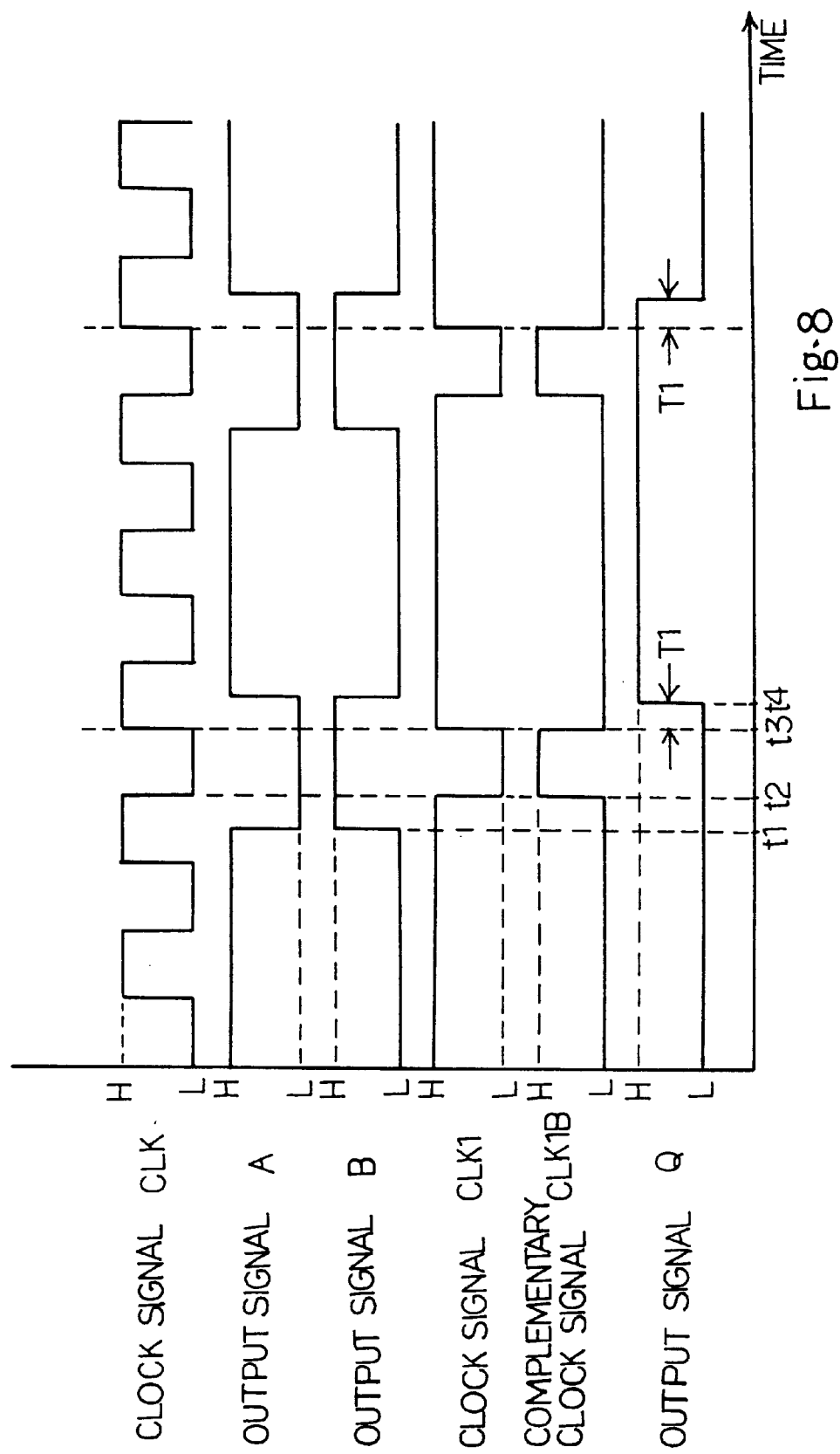
FIG. 8 is a timing chart showing the operation of the clocked master-slave flip flop circuit.

FIG. 8 illustrates the behavior of the equivalent circuit shown in FIG. 7. While the output signal A and the output signal B are in the high voltage level "H" and the low voltage level "L", respectively, the OR gate ORx and the AND gate ANDx are disabled, and the clock signal CLK1 and the complementary clock signal CLK1B are fixed to the high voltage level and the low voltage level, respectively, regardless of the clock signal CLK.

If the clock control signal CD and the complementary clock control signal CDB cause the logic gates LG1/LG2 to change the output signals A/B to the low voltage level and the high voltage level at time t1, the OR gate ORx and the AND gate ANDx are enabled, and change the clock signal CLK1 and the complementary clock signal CLK1B in response to the clock signal CLK and the complementary clock signal CLKB. The clock signal CLK is in the high level at time t1, and the complementary clock signal CLKB (not shown in FIG. 8) is in the low level at time t1. Then, the OR gate ORx and the AND gate ANDx maintain the clock signal CLK1 and the complementary clock signal CLK1B in the high voltage level and the low voltage level, respectively.

The clock signal CLK is changed to the low voltage level at time t2, and the complementary clock signal CLKB (not shown in FIG. 8) is concurrently changed to the high voltage level. Then, the OR gate ORx and the AND gate ANDx change the clock signal CLK1 and the complementary clock signal CLK1B to the low voltage level and the high voltage level, respectively.

The clock signal CLK is changed to the high voltage level at time t3, and the complementary clock signal CLKB (not shown in FIG. 8) is concurrently changed to the low voltage level. Then, the OR gate ORx and the AND gate ANDx change the clock signal CLK1 and the complementary clock signal CLK1B to the high voltage level and the low voltage level, respectively.

The output node Q is in the low voltage level at time t3, and, accordingly, the complementary output node QB is in the high voltage level. The high voltage level is supplied from the complementary output node QB to the input node D, and the delayed flip flop circuit DFFx changes the output node Q from the low level to the high level after minimum delay time T1. Thus, the logic gates LG1 and LG2 respectively change the output signals A and B to the low voltage level and the high voltage level immediately before the change of the output node Q.

APPLICATIONS

Figure 9:
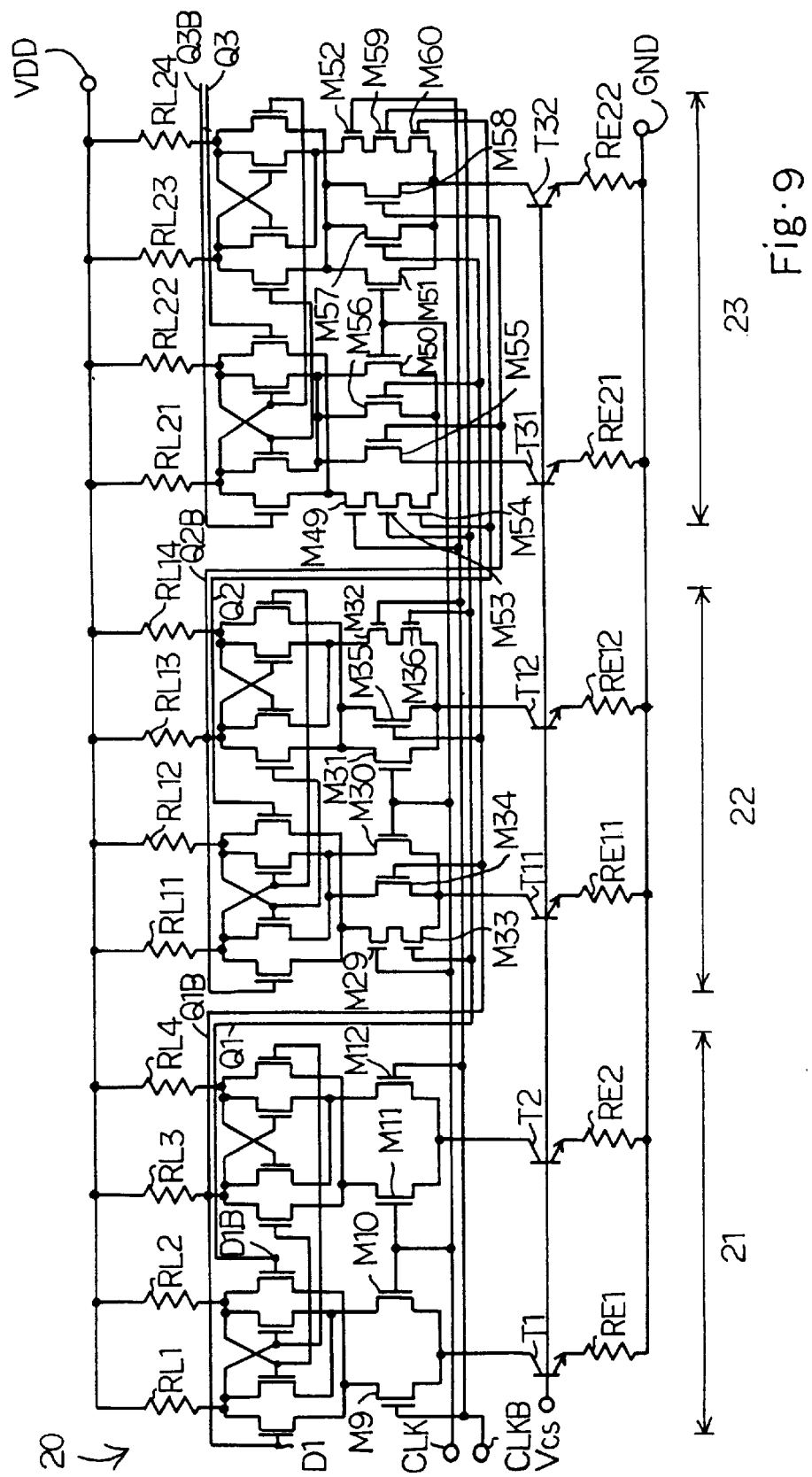
FIG. 9 is a circuit diagram showing the circuit configuration of a frequency divider according to the present invention.

FIG. 9 illustrate a frequency divider 20. The frequency divider 20 produces output signals Q1/Q2/Q3 twice, four times and eight times longer in pulse repetition period than a clock signal CLK. The frequency divider 20 largely comprises a conventional master-slave flip flop circuit 21 and two master-slave flip flop circuits 22 and 23. The conventional master-slave flip flop circuit 21 is similar to the conventional master-slave flip flop circuit 1 shown in FIG.

1 except for a constant current source. The n-channel enhancement type field effect transistors M13/M14 are replaced with n-p-n type bipolar transistors T1/T2, and the n-p-n type bipolar transistors T1/T2 form in combination the constant current source. The conventional master-slave flip flop circuit 21 produces the output signal Q1 twice longer in pulse repetition period than the clock signal CLK, and the complementary output signal Q1B and the output signal Q1 serve as a clock control signal and the complementary clock control signal to the master-slave flip flop circuit 22.

The master-slave flip flop circuits 22/23 are similar to the master-slave flip flop circuit 10. The constant current sources 12c and 14c are implemented by n-p-n type bipolar transistors T11/T12 and the resistors RE11/RE12, and the logic gates 12a, 12b, 14a and 14b are implemented by n-channel enhancement type field effect transistors M34, M33, M35 and M36, respectively. N-channel enhancement type field effect transistors M29, M30, M31 and M32 are corresponding to the n-channel enhancement type field effect transistors M15, M16, M21 and M22, respectively. The master-slave flip flop circuit 22 produces the output signal Q2 four times longer in pulse repetition period than the clock signal CLK and the complementary output signal Q2B. The complementary output signals Q1B/Q2B and the output signals Q1/Q2 serve as a clock control signal and the complementary clock control signal to the master-slave flip flop circuit 23.

As to the master-slave flip flop circuit 23, the constant current sources 12c and 14c are implemented by n-p-n type bipolar transistors T31/T32 and resistors RE21/RE22, and the logic gates 12a, 12b, 14a and 14b are implemented by n-channel enhancement type field effect transistors M55/M56, M53/M54, M57/M58 and M59/M60, respectively. N-channel enhancement type field effect transistors M49, M50, M51 and M52 are corresponding to the n-channel enhancement type field effect transistors M15, M16, M21 and M22, respectively. The master-slave flip flop circuit 23 produces the output signal Q3 eight times longer in pulse repetition period than the clock signal CLK and the complementary output signal Q3B.

Figure 10:
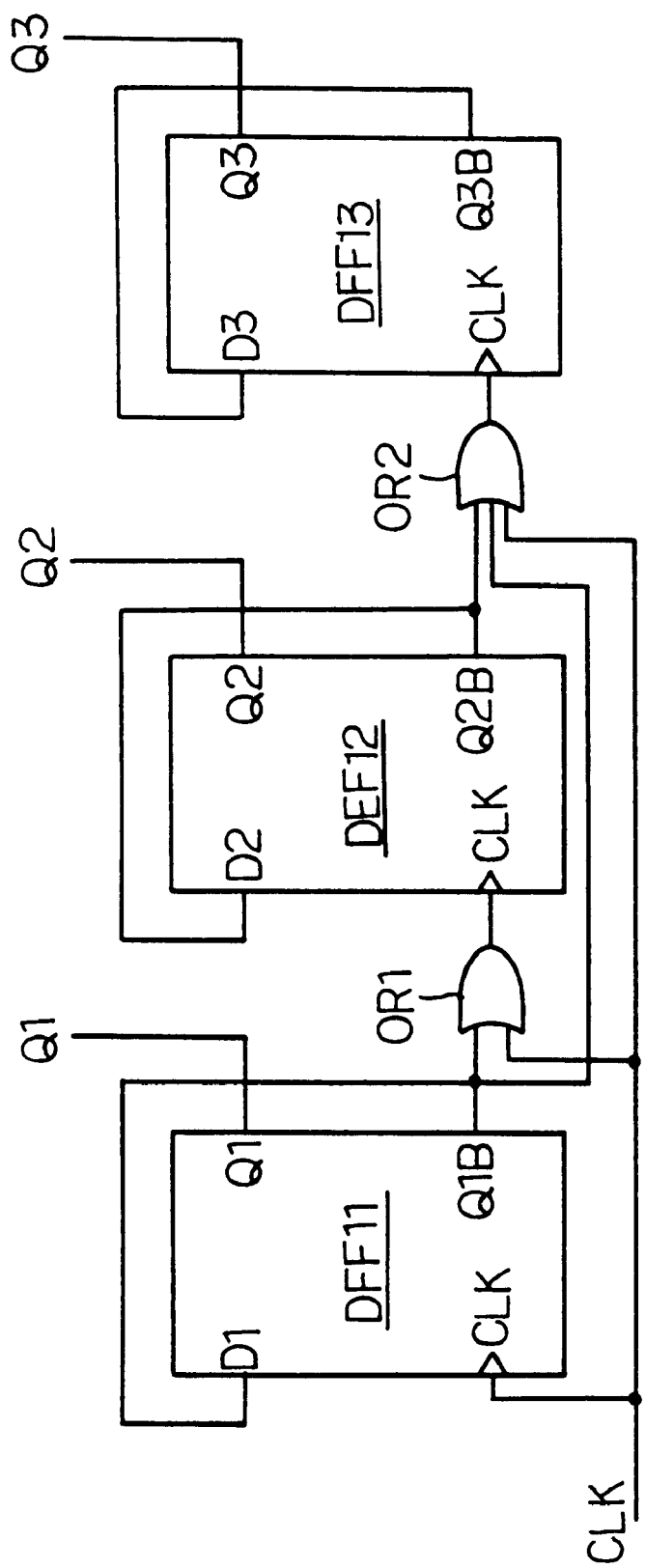
FIG. 10 is a circuit diagram showing an equivalent circuit of the frequency divider.

When focusing attention upon the output signals Q1, Q2 and Q3, the frequency divider 20 is equivalent to the combination of delayed flip flop circuits DFF11/DFF12/DFF13 and OR gates OR1/OR2 shown in FIG. 10. The equivalent circuit is expected to behave as shown in FIG. 11, and the logic gates required for the equivalent circuit are determined as follows. The output signal Q2 is changed between logic "1" level and logic "0" when the output signal Q1 is in logic "1" level in the previous cycle. This results from the OR function between the clock signal CLK and the complementary output signal Q1B of logic "0" level. On the other hand, the output signal Q3 is changed from logic "0" level to logic "1" level when both output signals Q1/Q2 are in the logic "1" level in the previous cycle. For this reason, the complementary output signals Q1B/Q2B are ORed with the clock signal CLK.

Figure 12:
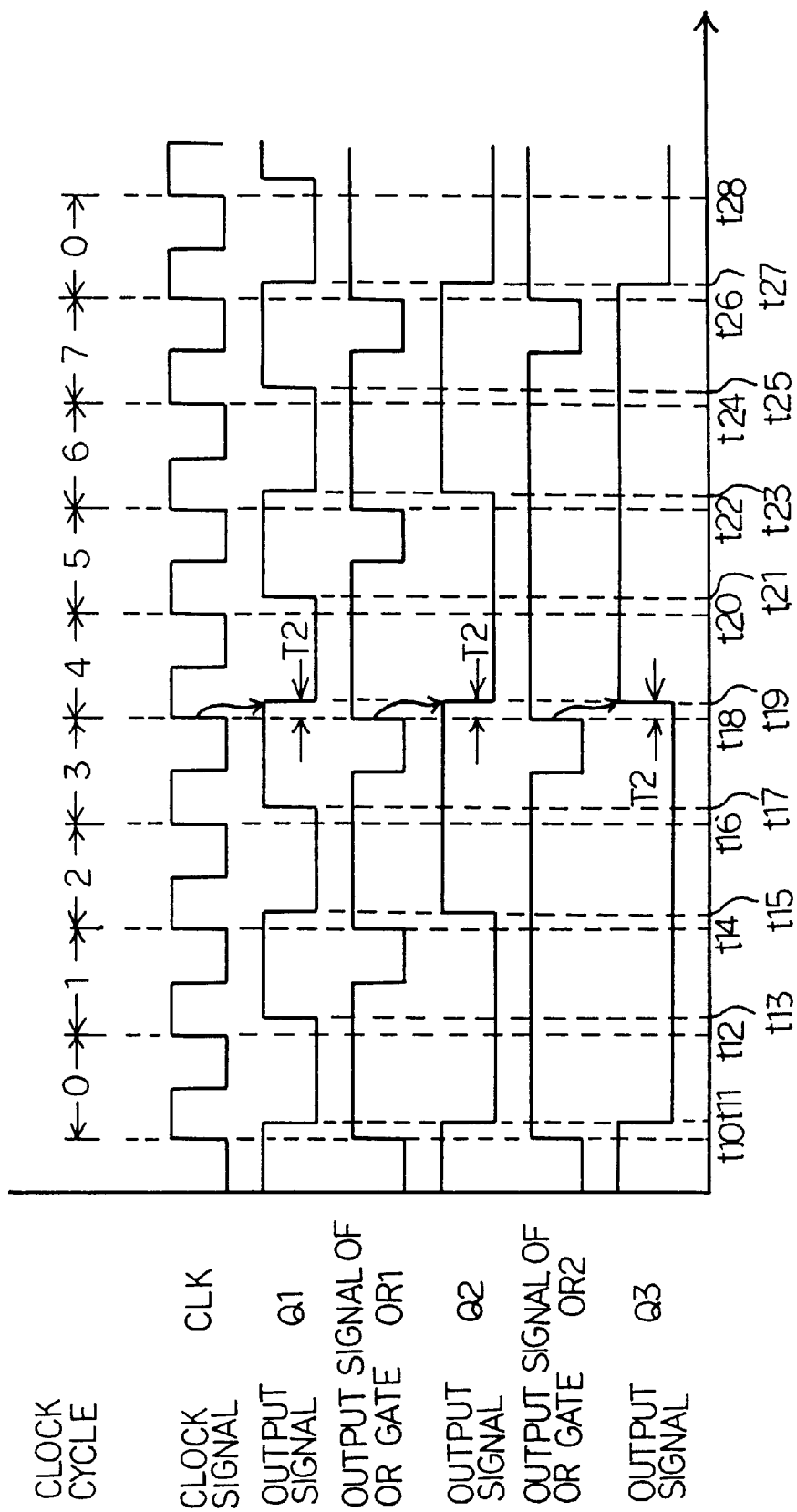
FIG. 12 is a timing chart showing the operation of the frequency divider.

FIG. 12 shows variation of output signals Q1, Q2 and Q3 of the equivalent circuit. The clock signal CLK defines the clock cycles, and the clock cycles are labeled with "0", "1", . . . and "7" as similar to those in FIG. 11. In this instance, the clock signal CLK rises at times t10, t12, t14, t16, t18 and t20, t22, t24, t26 and t28. The output signals Q1/Q2/Q3 are in the high voltage level before time t10, and, accordingly, the complementary output signals Q1B/Q2B/Q3B are in the low voltage level. The delayed flip flop circuit DFF11 simply doubles the pulse repetition period of the clock signal CLK, and changes the output signal Q1 between the high voltage level and the low voltage level at times t11, t13, t15, t17, t19, t21, t23, t25 and t27.

The OR gates OR1/OR2 are enabled with the complementary output signals Q1B/Q2B/Q3B of the low voltage level, and the clock signal CLK rises at time t10. Then, the complementary output signals Q2B/Q3B are latched by the delayed flip flop circuits DFF12/DFF13, and the output signals Q1/Q2/Q3 are changed to the low voltage level at time t11. Accordingly, the complementary output signals Q1B/Q2B/Q3B are changed to the high voltage level.

The OR gates OR1/OR2 are disabled with the complementary output signals Q1B/Q2B/Q3B, and keeps the output signals thereof in the high voltage level at time t12. For this reason, the delayed flip flop circuits DFF2/DFF13 do not respond to the clock signal CLK at time t12, and maintain the output signals Q2/Q3 in the high voltage level.

The output signal Q1 is changed to the high voltage level at time t13, and the complementary output signal Q1B of the low voltage level makes the OR gate OR gate OR1 enable. However, the output signal Q2 is maintained at the low voltage level at time t13, and the other OR gate OR2 is still disabled. For this reason, when the clock signal CLK rises at time t14, the output signal Q2 is changed to the high voltage level, and the output signal Q2 is still maintained in the low voltage level.

The clock signal CLK rises at time t16, and the output signal Q1 is changed to the high voltage level at time t17. The output signal Q2 is maintained in the high voltage level. Then, both of the OR gates OR1/OR2 are enabled with the complementary output signals Q1B/Q2B/Q3B, and the delayed flip flop circuits DFF12/DFF13 become responsive to the clock signal CLK. The clock signal rises at time t18. Then, the output signal Q2 is changed to the low voltage level at time t19, and the output signal Q3 is changed to the high voltage level. In this way, the output signals Q1/Q2/Q3 are sequentially changed between the high voltage level and the low voltage level as shown in FIG. 11.

Thus, the output signal Q2 is changed in even clock cycles due to the high voltage level of the output signal Q1 in odd clock cycles, and the output signal Q3 is changed in every fourth clock cycle. The delayed flip flop circuits DFF1/DFF2/DFF3 introduce time delay T2 between the rise of the clock signal CLK and the change of the output signals Q1/Q2/Q3.

Figure 1:
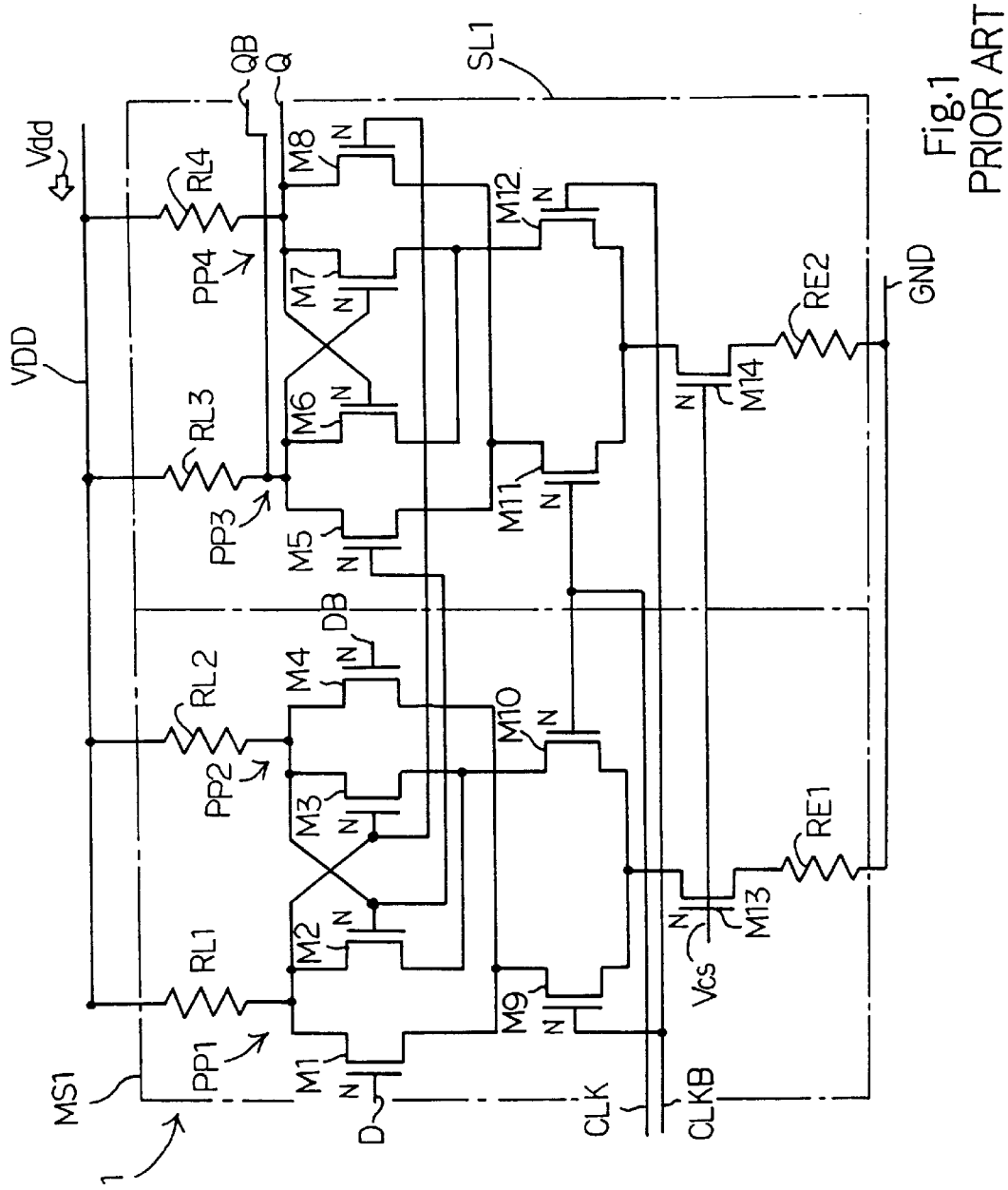
FIG. 1 is a circuit diagram showing the circuit configuration of the prior art clocked master-slave flip flop circuit.
Figure 13:
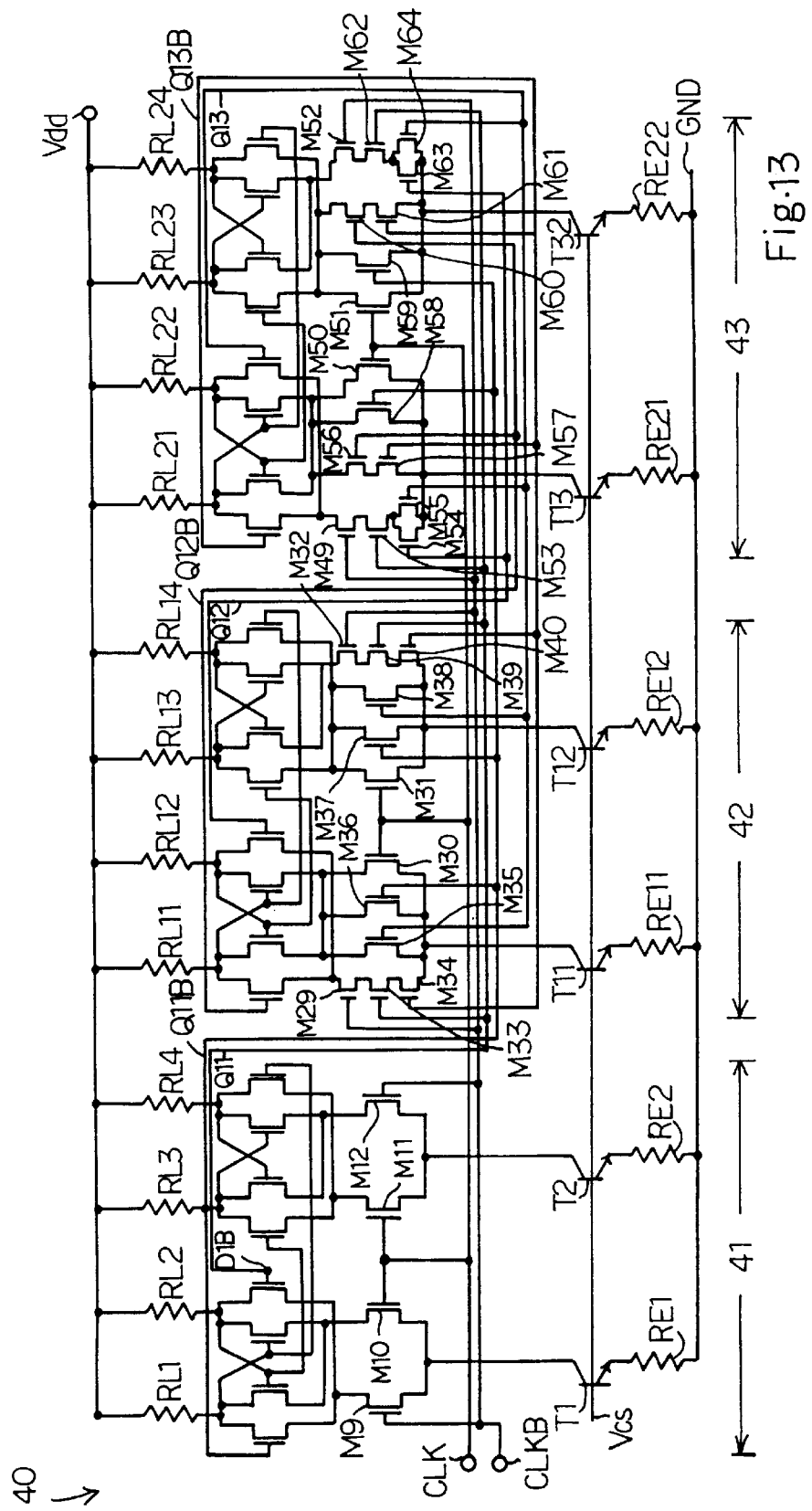
FIG. 13 is a circuit diagram showing the circuit configuration of another frequency divider according to the present invention.

FIG. 13 illustrate another frequency divider 40. The frequency divider 40 produces output signals Q13 six times longer in pulse repetition period than a clock signal CLK. The frequency divider 40 largely comprises a conventional master-slave flip flop circuit 41 and two master-slave flip flop circuits 42 and 43. The conventional master-slave flip flop circuit 41 is similar to the conventional master-slave flip flop circuit 1 shown in FIG. 1 except for a constant current source. The n-channel enhancement type field effect transistors M13/M14 are replaced with n-p-n type bipolar transistors T1/T2, and the n-p-n type bipolar transistors T1/T2 form in combination the constant current source. The conventional master-slave flip flop circuit 41 produces the output signal Q11 twice longer in pulse repetition period than the clock signal CLK, and the complementary output signal/the output signal Q11B/Q13 and the output signal/the complementary output signal Q13BQ11 serve as the clock control signal CD and the complementary clock control signal CDB to the master-slave flip flop circuit 42.

The master-slave flip flop circuits 42/43 are similar to the master-slave flip flop circuit 10. The constant current sources 12c and 14c are implemented by n-p-n type bipolar transistors T11/T12 and the resistors RE11/RE12, and the logic gates 12a, 12b, 14a and 14b are implemented by n-channel enhancement type field effect transistors M35/M36, M33/M34, M37/M38 and M39/M40, respectively. The field effect transistors M33/M34, M35/M36, M39/M40 and M37/M38 form an AND gate, an OR gate, an AND gate and an OR gate, respectively. N-channel enhancement type field effect transistors M29, M30, M31 and M32 are corresponding to the n-channel enhancement type field effect transistors M15, M16, M21 and M22, respectively. The master-slave flip flop circuit 42 produces the output signal Q12 and the complementary output signal Q12B. The combination of the output signals Q11/Q12/Q13 and the complementary output signals Q11B/Q12B/Q13B serve as the complementary clock data signal CDB and the clock data signal CD for the master-slave flip flop circuit 43, respectively.

As to the master-slave flip flop circuit 43, the constant current sources 12c and 14c are implemented by n-p-n type bipolar transistors T31/T32 and resistors RE21/RE22, and the logic gates 12a, 12b, 14a and 14b are implemented by n-channel enhancement type field effect transistors M56/M57/M58, M53/M54/M55, M59/M60/M61 and M62/M63/M64, respectively.

N-channel enhancement type field effect transistors M49, M50, M51 and M52 are corresponding to the n-channel enhancement type field effect transistors M15, M16, M21 and M22, respectively. The n-channel enhancement type field effect transistor M53 serves as an AND gate, and the n-channel enhancement type field effect transistors M54/M55 form an OR gate coupled in series to the AND gate. The n-channel enhancement type field effect transistors M56/M57 form an AND gate, and the n-channel enhancement type field effect transistor M58 serves as an OR gate for the n-channel enhancement type field effect transistor M50. The n-channel enhancement type field effect transistor M59 serves as an OR gate for the n-channel enhancement type field effect transistor M51, and the n-channel enhancement type field effect transistors M60/M61 form an AND gate in parallel to the OR gate. The n-channel enhancement type field effect transistor M62 serves as an AND gate serial to the n-channel enhancement type field effect transistor M52, and the n-channel enhancement type field effect transistors M63/M64 form an OR gate coupled in series to the AND gate. The master-slave flip flop circuit 43 produces the output signal Q13 six times longer in pulse repetition period than the clock signal CLK and the complementary output signal Q13B.

Figure 14:
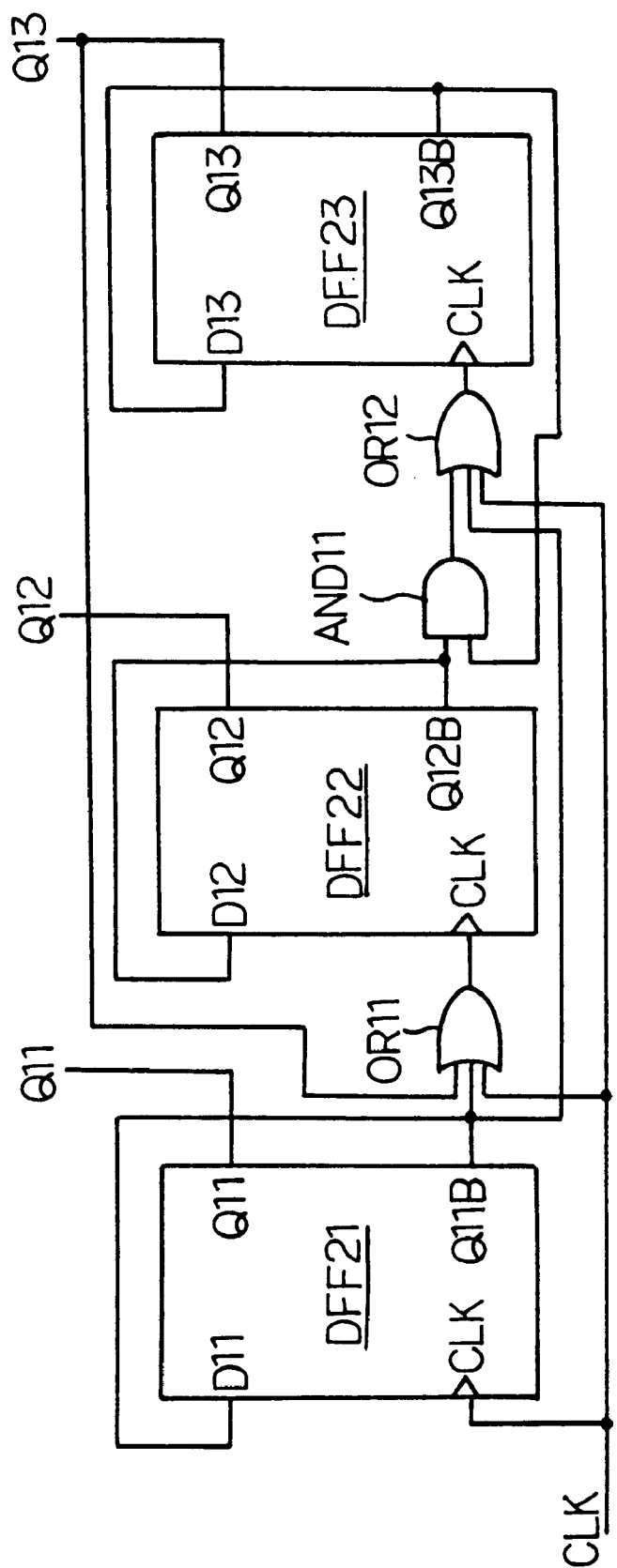
FIG. 14 is a circuit diagram showing an equivalent circuit of the frequency divider shown in FIG. 13.

When focusing attention upon the output signals Q11, Q12 and Q13, the frequency divider 20 is equivalent to the combination of delayed flip flop circuits DFF21/DFF22/DFF23, OR gates OR11/OR12 and an AND gate AND11 shown in FIG. 14. The equivalent circuit is expected to behave as shown in FIG. 15, and the logic gates required for the equivalent circuit are determined as follows. The output signal Q12 is changed between logic "1" level and logic "0" when the output signal Q11 and the output signal Q13 are in logic "1" level and logic "0" level in the previous cycle. This results from the OR function between the clock signal CLK, the output signal Q13 of logic "0" level and the complementary output signal Q11B of logic "0" level. On the other hand, the output signal Q13 is changed in logic level when the output signal Q11 and either output signal Q12 or Q13 are in the logic "1" level and logic "1" level in the previous cycle. In order to supply logic "0" level to the NR gate OR12, the complementary output signal Q11B is directly supplied to the OR gate OR12, and the complementary output signal Q12B is ANDed with the complementary output signal Q13B.

Figure 16:
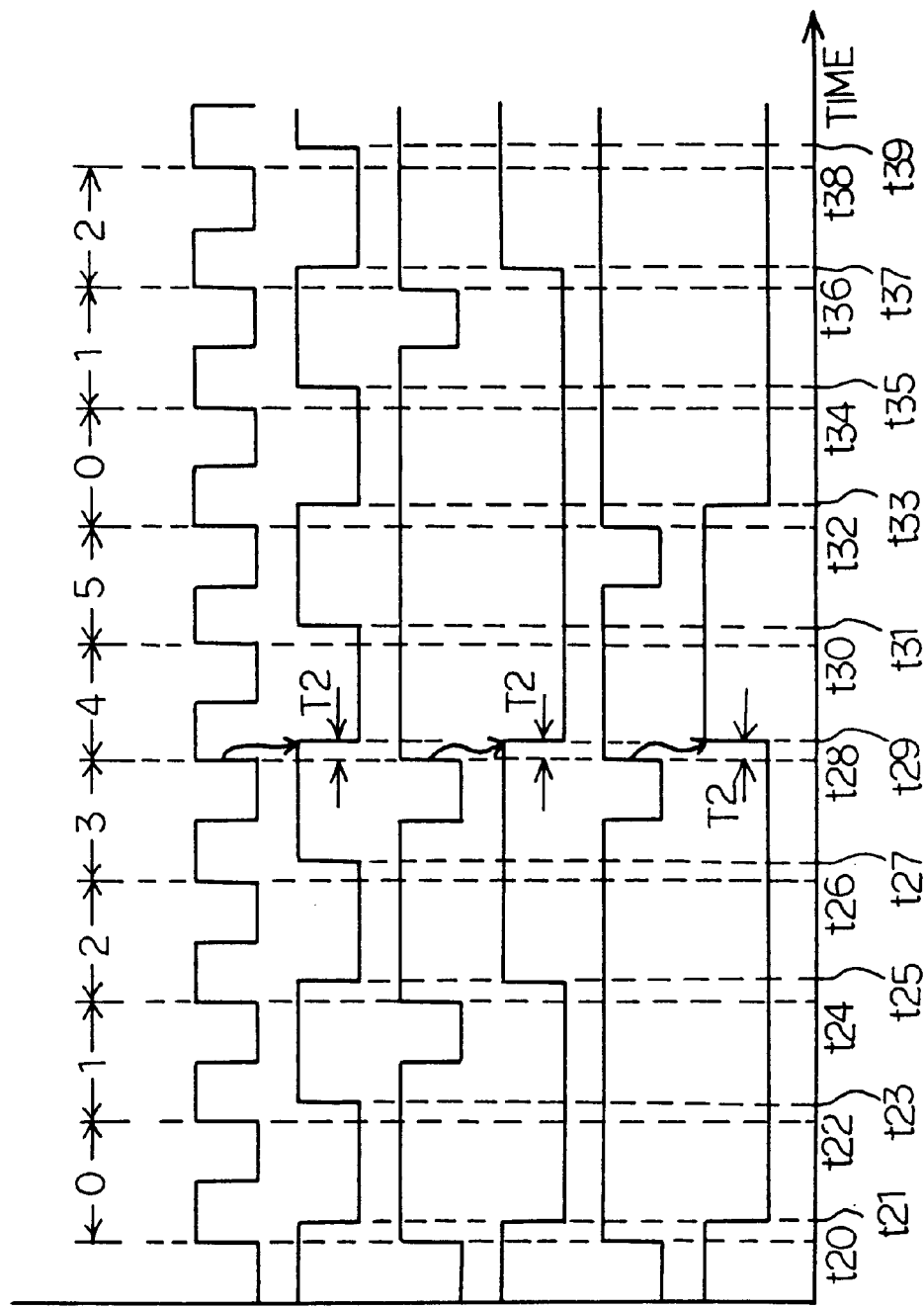
FIG. 16 is a timing chart showing the operation of the frequency divider.

FIG. 16 shows variation of output signals Q11, Q12 and Q13 of the equivalent circuit. The clock signal CLK defines the clock cycles, and the clock cycles are labeled with "0", "1", . . . and "5" as similar to those in FIG. 15. In this instance, the clock signal CLK rises at times t20, t22, t24, t26, t28 and t30, t32, t34, t36 and t38. The output signals Q11/Q12/Q13 are in the high voltage level before time t20, and, accordingly, the complementary output signals Q11B/Q12B/Q13B are in the low voltage level. The delayed flip flop circuit DFF21 simply doubles the pulse repetition period of the clock signal CLK, and changes the output signal Q11 between the high voltage level and the low voltage level at times t21, t23, t25, t27, t29, t31, t33, t35 and t37.

The output signal Q11 is in the low voltage level in every even clock cycle and clock cycle "0", and the complementary output signal Q11B is in the high voltage level in those clock cycles. Therefore, the OR gate OR11 is disabled with the complementary output signal Q11B. On the other hand, the output signal Q13 is in the high voltage level in clock cycles "4" and "5", and the OR gate OR11 is disabled with the output signal Q13. Both of the complementary output signal Q11B and the output signal Q13 are in the low voltage level in the odd clock cycles except for clock cycles "4" and "5", and, for this reason, the OR ate OR11 is enabled with the complementary output signal Q11B and the output signal Q13 in clock cycles "1" and "3". The delayed flip flop circuit DFF21 changes the output signal Q12 in the next clock cycles "2" and "4".

The OR gate OR12 is disabled with the complementary output signal Q11B in every even clock cycle and clock cycle "0". The AND gate AND11 produces the output signal of the high voltage level from the complementary output signals Q12B/Q13B in clock cycles "0" and "1", and the output signal of the high voltage level disables the OR gate OR12. The complementary output signal Q11B is in the low voltage level in clock cycles "3" and "5", and the complementary output signals Q12B and Ql3B cause the AND gate AND11 to produce the output signal of the low voltage level. For this reason, the delayed flip flop circuit DFF23 changes the output signal Q13 in the next clock cycles "4" and "0". The delayed flip flop circuits DFF11/DFF12/DFF13 introduce delay T2 between the leading edges of the clock signal CLK and the output signal s Q11/Q12/Q13.

Figure 2:
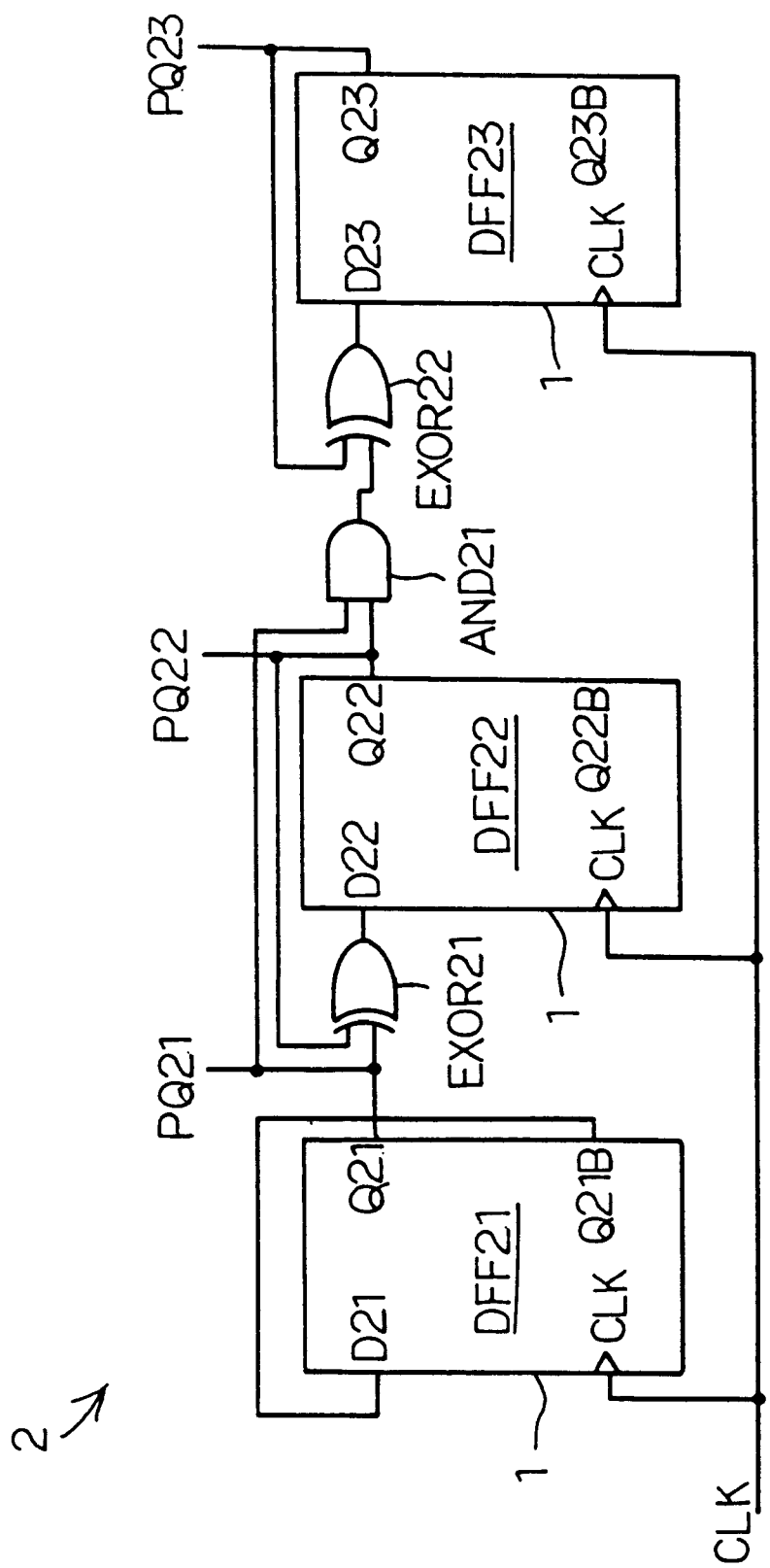
FIG. 2 is a circuit diagram showing the circuit configuration of the prior art synchronous frequency divider for the output pulse signal eight times longer than the clock signal.
Figure 3:
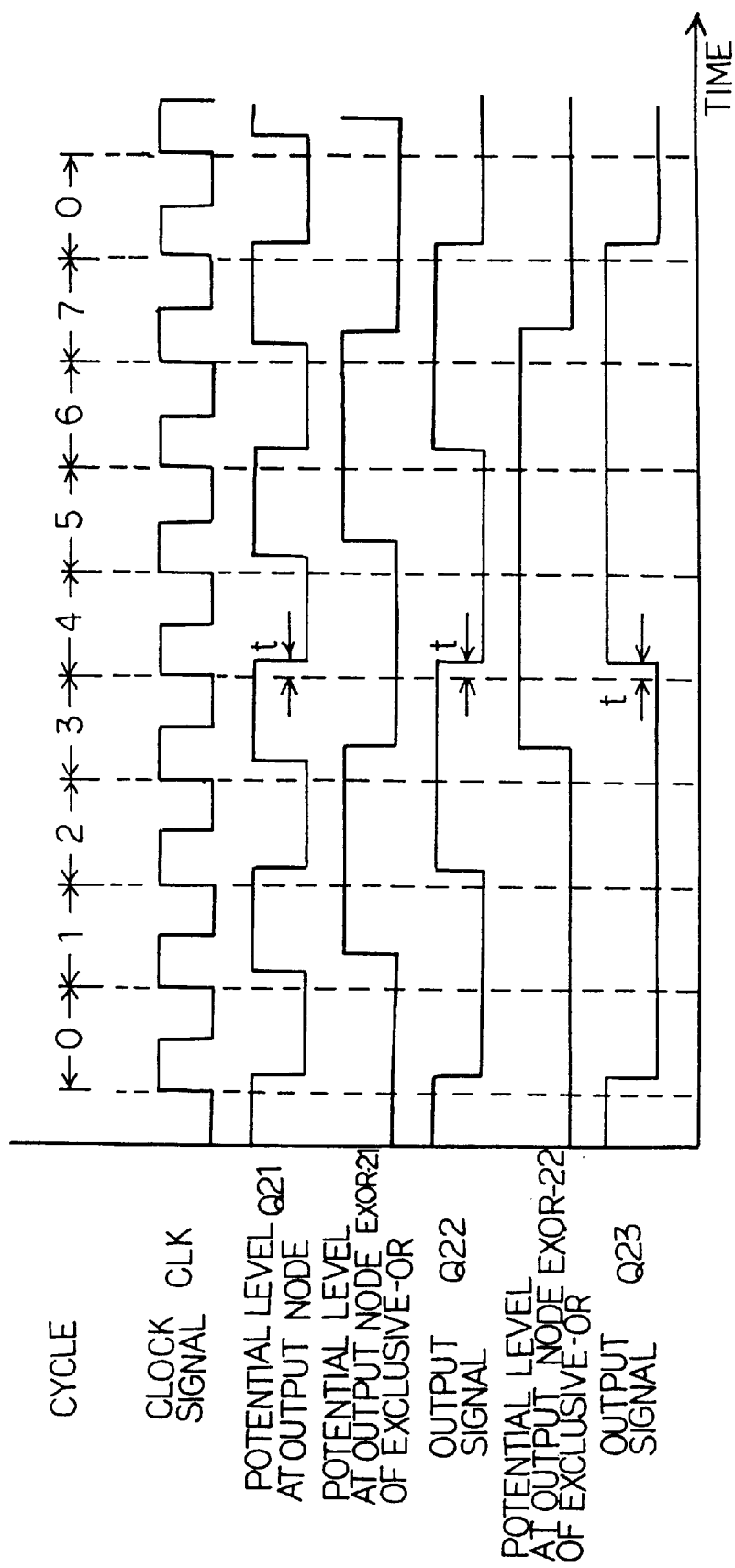
FIG. 3 is a timing chart showing the operation of the prior art synchronous frequency divider shown in FIG. 2.
Figure 4:
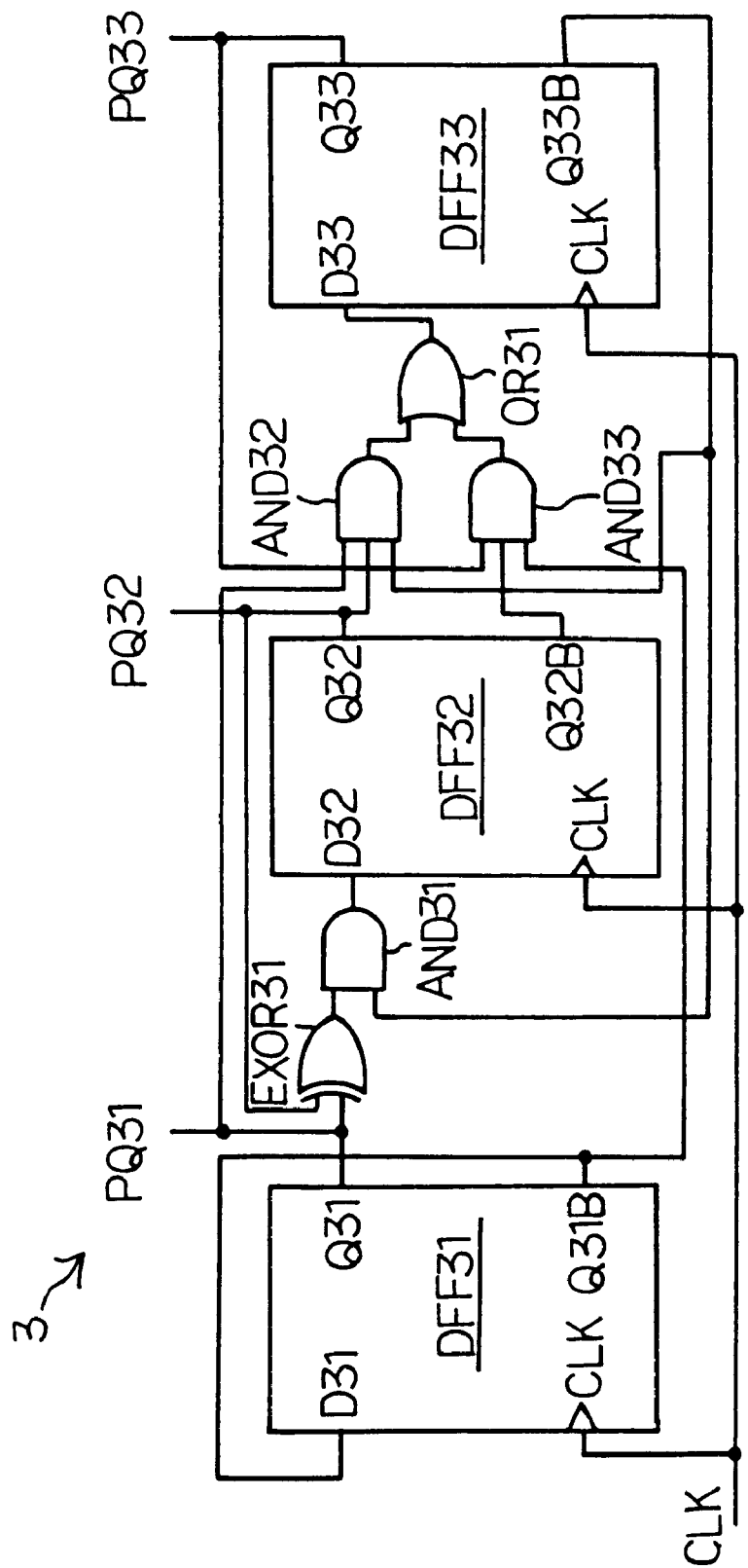
FIG. 4 is a circuit diagram showing the circuit configuration of the prior art synchronous frequency divider for the output pulse signal six times longer than the clock signal.
Figure 5:
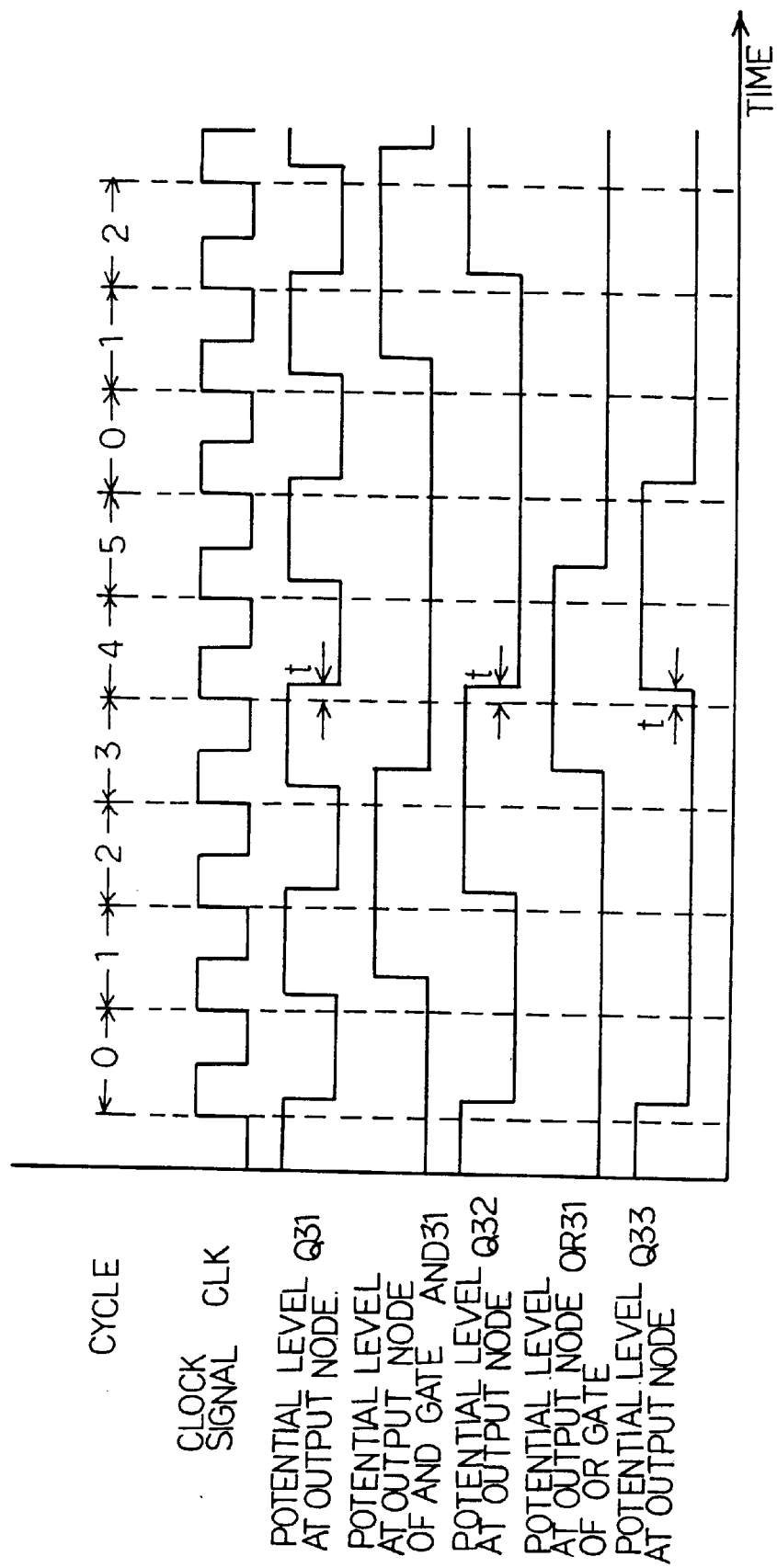
FIG. 5 is a timing chart showing the operation of the prior art synchronous frequency divider shown in FIG. 4.

As will be appreciated from the foregoing description, the clocked masterslave flip flop circuit according to the present invention improves the integration density and the electric power consumption. The first advantage is derived from the built-in clock controller or the logic gates LG1/LG2. If the logic gates are separated from the master-slave flip flop circuit as shown in FIG. 2 or 4, the logic gates require respective constant current sources. However, those circuit components are shared between the logic gates and the current mirror circuit, and the master-slave flip flop circuit according to the present invention causes the frequency divider to reduce the number of circuit components. This results in the improvement of integration density. In fact, the master-slave flip flop circuit makes the frequency divider shown in FIG. 9 decrease the occupation area at 3-percent and the frequency divider shown in FIG. 13 decrease the occupation area at 40 percent.

The second advantage is derived from the through-current also shared between the current mirror circuit and the logic gates. The through-current passes the n-channel enhancement type field effect transistors M15/M22 and, thereafter, the logic gates 12b/14b, and any through-current does not flow the logic gates 12b/14b independently of the current mirror circuit. The master-slave flip flop circuit decreases the electric power consumption of the frequency divider shown in FIG. 9 at 33 percent and the electric power consumption of the frequency divider shown in FIG. 13 at 45 percent.

Moreover, a new frequency divider is designed by using the master-slave flip flop circuit within short time period. When a prior art frequency divider is designed, the designer needs to consider the output signal output in the next clock cycle for the input data signal, and consumes long time period for complicated logic sequence. On the other hand, the designer is expected to consider the state immediately before the inversion of the output data signal. This results in simplification of the design work.

Although particular embodiments of the present invention have been shown and described, it will be obvious to those skilled in the art that various changes and modifications may be made without departing from the spirit and scope of the present invention.

For example, the clocked master-slave flip flop circuit is available for any electric circuit in so far as the electric circuit requires a master-slave flip flop circuit and logic gates.

Moreover, the present invention is applicable to any kind of flip flop circuit. The master section MS10 may be used as a flip flop circuit independently of the slave section SL10.

The clocked master-slave flip flop circuit may be implemented by p-channel enhancement type field effect transistors or bipolar transistors.

The logic circuits LG1 or LG2 are not limited to the OR gate and the AND gate. The circuit configuration of each logic circuit is dependent on the application such as the frequency divider.

What is claimed is:

1. A flip flop circuit comprising:
   a data storage circuit comprising:
      a differential amplification stage connected to a first source of power voltage and responsive to an input data signal for storing said input data signal in the form of a potential difference and
      a constant current source connected to said differential amplification stage and responsive to a clock signal so as to enable said differential amplification stage; and
   a clock controller connected to said constant current source of said data storage circuit for controlling said constant current source in accordance with a clock data signal wherein said differential amplification stage comprises:
      a first resistor connected to said first source of power voltage,
      a second resistor connected to said first source of power voltage in parallel to said first resistor,
      a first transistor and a second transistor responsive to said input data signal and a complimentary input data signal for producing a first current path between one of said first and second resistors and a first node and producing said potential difference between a second node connected to said first resistor and a third node connected to said second resistor and,
      a third transistor and a fourth transistor connected in parallel to said first transistor and said second transistor between said second and third nodes and a fourth node and responsive to said potential difference for maintaining said potential difference between said second node and said third node;
   wherein said constant current source comprises:
      a fifth transistor and a sixth transistor responsive to said clock signal and a complimentary clock signal so as to provide a second major current path from one of said first and fourth nodes; and
   wherein said clock controller comprises:
      a first logic circuit connected between said fourth node and a second source of power voltage for performing a first logic function in response to said clock data signal, and
      a second logic circuit connected between said fifth transistor and said second source of power voltage for performing a second logic function which is inverse to said first logic function in response to a complementary clock data signal.

2. The flip flop circuit as set forth in claim 1, in which each of said first transistor to said sixth transistor is a field effect transistor.

3. The flip flop circuit as set forth in claim 1, in which said first logic circuit and said second logic circuit are implemented by an OR gate and an AND gate, respectively.

4. The flip flop circuit as set forth in claim 1, in which said data storage circuit and said clock controller serve as a master section forming in combination a master-slave flip flop circuit together with a slave section.

5. The flip flop circuit as set forth in claim 4, in which said slave section comprises
   a second data storage circuit, and
   a second clock controller.

6. The flip flop circuit as set forth in claim 5, wherein:
   said second data storage circuit comprises:
      a third resistor connected to said first source of power voltage,
      a fourth resistor connected to said first source of power voltage.

7. The flip flop circuit as set forth in claim 6, in which each of said first transistor to said twelfth transistor is a field effect transistor.

8. The flip flop circuit as set forth in claim 6, wherein said first and third logic circuits each comprise an OR gate and said second and fourth logic circuits each comprise an AND gate.

9. A frequency divider comprising
   a first delayed flip flop circuit responsive to a clock signal for producing a first output signal twice longer in pulse repetition period than said clock signal and a first complementary output signal complementary to said first output signal,
   a plurality of second delayed flip flop circuits connected in cascade, each of said plurality of second delayed flip flop circuit comprising:
      a data storage circuit comprising:
         a differential amplification stage connected to a first source of power voltage level and having a data input node supplied with a second complementary output signal complementary to a second output signal and a pair of output data nodes for producing said second output signal and said second complementary output signal and
         a constant current source connected to said differential amplification stage and responsive to said clock signal so as to enable said differential amplification stage, and
      a clock controller connected to said constant current source for controlling said constant current source in accordance with said first complementary output signal, said clock signal.

10. The frequency divider as set forth in claim 9, wherein said clock controller comprises an OR gate.

* * * * *

UNITED STATES PATENT AND TRADEMARK OFFICE
CERTIFICATE OF CORRECTION

PATENT NO.   :   5,945,858
DATED        :   August 31, 1999
INVENTOR(S)  :   Masaharu SATO It is certified that error(s) appears in the above-identified patent and that said Letters Patent is hereby corrected as shown below:

Column 14,   line 30,   after "voltage" insert --in parallel to said third resistor, a seventh transistor and an eighth transistor responsive to another potential difference between a sixth node and a seventh node for producing a third current path between one of said third and fourth resistors and a fifth node and producing another potential difference between said sixth node connected to said third resistor and said seventh node connected to said fourth resistor, a ninth transistor and a tenth transistor connected in parallel to said seventh transistor and said eighth transistor between said sixth and seventh nodes and an eighth node and responsive to said potential difference between said second node and said third node for maintaining said another potential difference between said sixth node and said seventh node and an eleventh transistor and a twelfth transistor responsive to said clock signal and said complementary clock signal so as to provide a fourth major current path from one of said fifth and eighth nodes; and said second clock controller comprises:

UNITED STATES PATENT AND TRADEMARK OFFICE
CERTIFICATE OF CORRECTION

PATENT NO. : 5,945,858
DATED : August 31, 1999
INVENTOR(S) : Masaharu SATO

It is certified that error appears in the above-identified patent and that said Letters Patent is hereby corrected as shown below:

a third logic circuit connected between said eighth node and said second source of power voltage for performing said first logic function in accordance with said clock data signal, and a fourth logic circuit connected between said twelfth transistor and said second source of power voltage for performing a second logic function which is inverse to said first logic function in accordance with said complementary clock data signal.--

Signed and Sealed this

Sixteenth Day of May, 2000

Attest:

Q. TODD DICKINSON

Attesting Officer

Director of Patents and Trademarks